United States Patent [19]

Booth

[11] Patent Number: 5,418,063

[45] Date of Patent: May 23, 1995

[54] CARBON-CARBON COMPOSITE AND METHOD OF MAKING

[75] Inventor: Roy E. Booth, Duncanville, Tex.

[73] Assignee: Loral Vought Systems Corporation, Grand Prairie, Tex.

[21] Appl. No.: 298,650

[22] Filed: Jan. 18, 1989

[51] Int. Cl.[6] .......................... B32B 9/00; B05D 5/12
[52] U.S. Cl. ................................ 428/408; 428/552; 427/113
[58] Field of Search ................. 428/408, 552; 427/113

[56] References Cited

U.S. PATENT DOCUMENTS

| | | | |
|---|---|---|---|
| 4,209,500 | 6/1980 | Chwastiak | 423/447.6 |
| 4,368,234 | 1/1983 | Palmer et al. | 428/408 X |
| 4,659,624 | 4/1987 | Yeager et al. | 428/408 |

OTHER PUBLICATIONS

McAllister et al., *Multidirectional Carbon-Carbon Composites*, Handbook of Composites, vol. 4, pp. 109–175.
Delmonte, *Technology of Carbon & Graphite Fiber Composites*, Van Nostrand Reinhold Co., pp. 397–421.
Kirk-Othmer, Encyclopedia of Chemical Technology, 3rd Ed., 1978, vol. 4, pp. 622–631, "Carbon (Carbon and Artificial Graphite)".
Kirk-Othmer, Encyclopedia of Chemical Technology, 3rd Ed., Supp. vol., pp. 260–281, "Composites, High Performance".
Rubin, L., "High-Modulus Carbon Fiber Based Carbon-Carbon for Space Applications", 1986, Report No. SD-TR-86-45 Space Division, Air Force Systems Command, Los Angeles Air Force Station, Los Angeles, California 90009-2960.

*Primary Examiner*—Peter A. Nelson
*Attorney, Agent, or Firm*—Richards, Medlock & Andrews

[57] ABSTRACT

Carbon-Carbon composite products comprising laminate plies formed from the carbon fabric having pitch-based carbon strands of relatively high modulus of elasticity in the warp direction. The fill direction carbon strands have a relatively low modulus of elasticity when compared to the warp direction strands and have a substantially lower end count than the higher modulus warp direction strands. A carbonaceous matrix is integrated with the fabric plies in order to bond the plies together. The matrix material may be glassy carbon or more preferably a crystalline graphitized carbon. In forming such carbon-carbon composite products, a layup is established of a plurality of the carbon fabric plies impregnated with a carbon containing matrix material, typically a thermoset resin. The layup is cured or partially cured and then pyrolized to a temperature sufficient to carbonize the matrix material. The carbonized matrix material is then densified by chemical vapor infiltration (CVI) using a gaseous hydrocarbon material as a carbon source. Following the densification step, the layup is heated at an elevated temperature substantially in excess of the pyrolysis temperature which is sufficient to graphitize the matrix material.

21 Claims, 1 Drawing Sheet

CARBON-CARBON COMPOSITE AND METHOD OF MAKING

TECHNICAL FIELD OF THE INVENTION

This invention relates to carbon-carbon composite structures and more particularly to carbon-carbon composites arrived from biased carbon fabrics incorporating pitch based high modulus carbon strands in the warp direction and methods for the production of such products.

BACKGROUND OF THE INVENTION

High performance composite products such as those used in the aerospace and aviation industry can take the form carbon-carbon composite materials. Carbon-carbon composite products are derived from high carbon content fibers which are arranged in laminate plies of fabrics or tapes and integrated into a composite structure by means of a carbonaceous matrix. The tapes, consisting of a plurality of unidirectional carbon strands and the fabrics, composed of woven warp and fill strands, are formed from strands, sometimes referred to as yarns or tows, of bundles of discrete carbon fibers of a very small diameter, typically 4-12 microns. A single tow may be formed of hundreds or thousands of individual fiber filaments. The carbon fibers may be resin based fibers such as polyacrylonitrile (PAN) or rayon or they may be pitch-based fibers. The pitch based fibers are generally produced from mesophase pitch and normally have an extremely high carbon content, for example about 99+%. The resin-based carbon fibers also have a high carbon content, although somewhat less than that of the pitch based fibers. PAN fibers have a carbon content of about 92-99% whereas rayon fibers have a carbon content of about 97-99%. The matrix material is generally derived from thermoset resins such as furan polymers or phenol formaldehyde polymers, although pitch based materials may also be employed to supply the composite matrix.

Carbon fibers and fabrics useful in the formulation of carbon-carbon composites are described Kirk-Othmer, "Encyclopedia of Chemical Technology," 3rd Ed., 1978, Volume 4, pages 622-631 under the heading Carbon (Carbon and Artificial Graphite). Characteristics are described in Kirk-Othmer for rayon-based, PAN-based and pitch-based and mesophase pitch-based fibers. As described there, properties such as Young's modulus (the modulus of elasticity), electrical and thermal conductivity, and tensile strength depend on the degree of preferred orientation. Very highly oriented carbon fibers possess a Young's modulus close to that of a single graphite crystal. Electrical and thermal conductivity of the fiber also increase with increased orientation. The Kirk-Othmer article also describes the formation of graphitized carbon and glassy carbon.

High performance composites, including those based upon carbon fibers, and their preparation are also described in the Supplement Volume of Kirk-Othmer, 3rd Ed., in pages 260-281 under the heading "Composites, High Performance." A suitable fabrication sequence for producing composite products is described in pages 266-270. This Kirk-Othmer article describes the sequence of the combining of fibers with a matrix material and the subsequent stacking, bagging and curing of the laminate plies to produce a composite product. As described there, a plurality of laminate sheets of prepreg tape are stacked to form a laminate layup on a forming surface. A nylon bag is placed over the layup and sealed at its edges. A vacuum is then applied to the sealed assembly in order to evacuate air from the layup. The assembly is then placed in an autoclave and heated and pressurized to effect a cure cycle.

As described in the above-mentioned Kirk-Othmer, vol. 4, on page 626, 627, mesophase pitch-based fibers have a relatively high modulus of elasticity. The use of these fibers in forming carbon-carbon composites structures useful as structural materials, thermal radiators, or antennas is also disclosed in Rubin. L, "High-Modulus Carbon Fiber Based Carbon-Carbon for Space Applications, 1986, Report No. SD-TR-86-45 Space Division, Air Force Systems Command, Los Angeles Air Force Station, Los Angeles, Calif. 90009-2960. In Rubin, a carbon-carbon composite structure was produced from a flat layup of 16 plies of fabric woven from a pitch based carbon yarn obtained from Union Carbide Corporation and identified as P-100 yarn. .The laminate plies were in the form of a fabric woven from the yarn in an 8-harness satin weave having a linear density (end count) of 20 yarn ends per inch in both the warp and fill directions. In the Rubin procedure, the matrix material was formed from A240 petroleum pitch available from Ashland Oil Company. Processing included heating the preform layup to 540° C. at 100 psi in a press under a nitrogen atmosphere in order to pyrolyze the matrix pitch. The composite was then heated to 1500° C. in argon, reimpregnated with the pitch and the pyrolysis step repeated. The product was then graphitized by heating at a temperature of 2200° C. under an argon atmosphere. At the conclusion, the product was treated with carbon vapor deposition at 1100° C. in order to reduce porosity and increase strength. The Rubin article reports on thermal conductivity, diffusivity thermal expansion, and electrical resistivity of the product.

U.S. Pat. No. 4,659,624 to Yeager et al. discloses carbon-carbon composite products in which desired structural properties are provided along a predetermined direction of load through the use of carbon fiber unidirectional tapes either alone or in combination with fabrics. Yeager discloses that strength tailoring of the product can be achieved during the initial layup and that increased strength generally will be obtained in the direction parallel to the longitudinal direction of the tows of the unidirectional tape plies. In forming the product, after the plies are laid up with the desired resinous matrix material, an initial cure cycle is undertaken to bind the plies together. Thereafter a pyrolysis cycle is instituted in order to carbonize the matrix material. This may involve a cycle of about three days in which a final temperature of about 1500° F. is reached. Thereafter, the product is subjected to a densification procedure which can be accomplished through liquid impregnation or through chemical vapor deposition. The preferred technique is liquid phase impregnation in which a carbonizable liquid such as furfuryl alcohol or a phenolic based resin is used to impregnate the cured and pyrolized carbon-carbon material. As described in the Yeager patent, densification can be carried out by introducing the liquid phenolic resin into the product under an applied pressure of about 80 to 100 psi for a period of about 30 minutes. The product is then heated to a pyrolysis temperature of about 1500° F. The densification procedure can be repeated up to about 5 times to obtain the desired density and strength of the product.

SUMMARY OF THE INVENTION

In accordance with the present invention there is provided a new and advantageous process for the formation of a carbon-carbon composite product in which pitch based carbon strands are employed to impart good mechanical and thermal physical properties to the product. In carrying out the invention, a layup is established of a plurality of carbon laminate plies. Each ply comprises a carbon fabric impregnated with a carbon containing matrix material, typically a thermoset resin of the type disclosed, for example, in the aforementioned patent to Yeager et al. The carbon fabric comprising the laminate plies is formed of pitch based carbon strands in the warp direction. The pitched based strands have a relatively high modulus of elasticity. The carbon fabric is further composed of carbon strands in the fill direction which have a relatively low modulus of elasticity in comparison with the modulus of elasticity of the warp direction strands. Preferably the fill direction strands are comprised of polymer based carbon-carbon fibers, specifically PAN fibers. Also it is preferred that the warp direction strands have a substantially higher end count than the fill direction carbon strands. Preferably, the carbon fabric used in forming the laminate plies has a plain weave and the end count of the warp direction carbon strands is at least twice the end count of the fill direction carbon strands.

After stacking the layup it may be bagged, and where a thermoset resin is used, cured or partially cured, by any suitable technique such as described in the aforementioned Kirk-Othmer Supplemental Volume article, and then pyrolized to a temperature sufficient to carbonize the matrix material. The carbonized matrix material is then densified. Preferably, densification is carried out by chemical vapor infiltration (CVI) using a gaseous hydrocarbon material as a carbon source. Following the densification step, the layup is heated at an elevated temperature substantially in excess of the pyrolysis temperature which is sufficient to graphitize the matrix material.

A further aspect of the invention involves a carbon-carbon composite product. The product comprises a plurality of laminate plies which are formed from the carbon fabric having pitch based carbon strands of relatively high modulus elasticity in the warp direction. The carbon strands in the fill direction are polymer based and have a relatively low modulus of elasticity when compared to the warp direction strands. The lower modulus strands have a substantially lower end count than the end count of the higher modulus strands in the warp direction. A carbonaceous matrix is integrated with the fabric plies in order to bond the plies together. In one aspect of the invention, the matrix material is in the form of glassy carbon. In this case, the ratio of the in-plane thermal conductivity to the transverse conductivity of the composite structure is very high, normally about 50 or more. In a further, usually preferred aspect of the invention, the carbonaceous matrix material has been graphitized to provide a crystalline graphitized structure. In this case, the ratio of the in-plane thermal conductivity to the transverse thermal conductivity is substantially less, normally about 15:1 or less.

BRIEF DESCRIPTION OF THE DRAWING

The drawing is a schematic illustration of a carbon fabric showing the relationship of warp direction and fill direction fiber strands.

DETAILED DESCRIPTION

Figure 1:
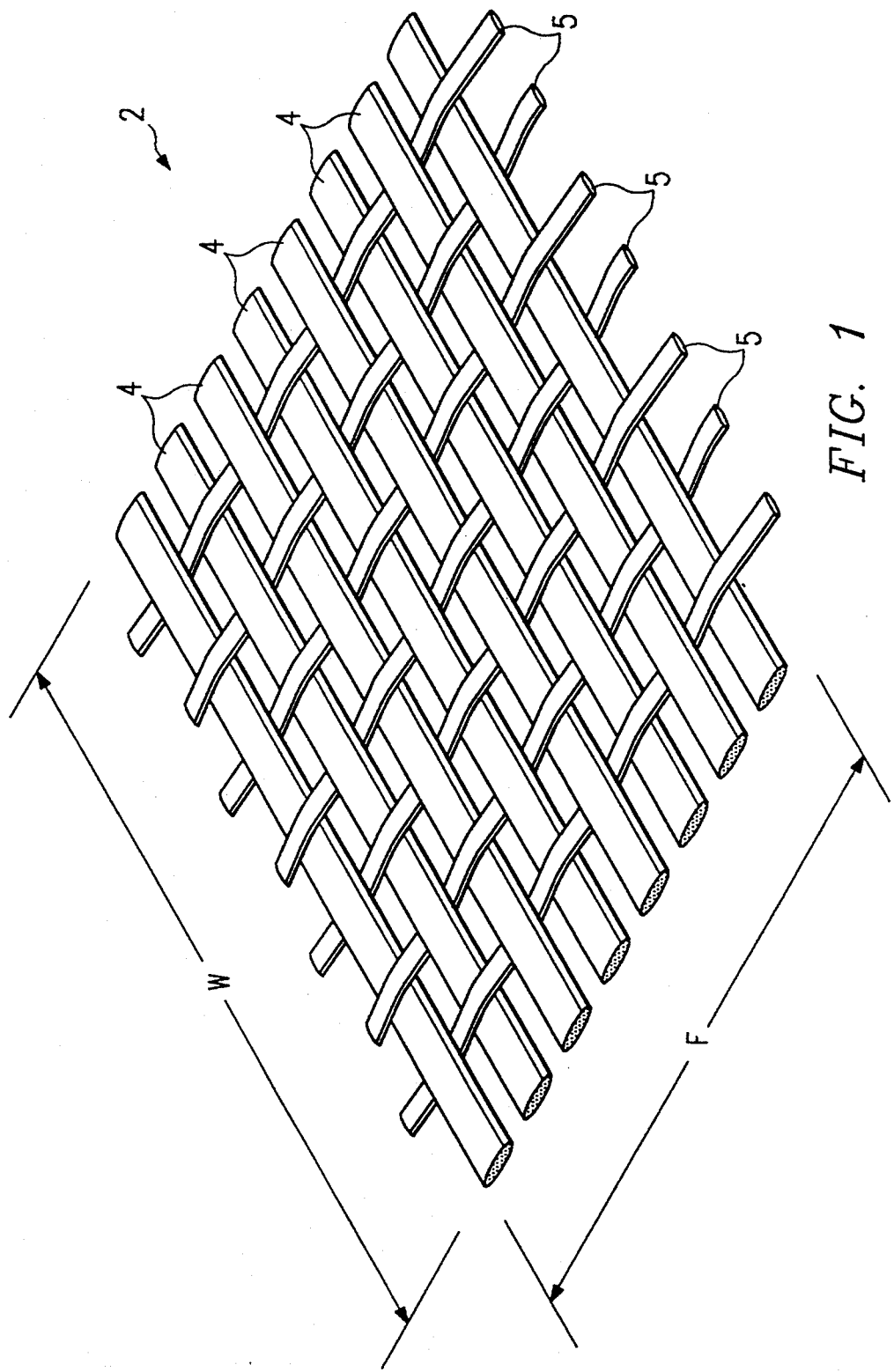

The present invention involves carbon-carbon composites and their preparation based upon use of fabrics woven from two different carbon fibers. One type of carbon fiber, employed in strands or yarns oriented in the warp direction of the fabric, is derived from carbonaceous pitch having a high mesophase (liquid crystal) content which may range up to 100%. Pitch-based fibers are described in the aforementioned Kirk-Othmer and Supplemental Volume 4 article and also in U.S. Pat. No. 4,209,500 to Chwastiak. As described in Chwastiak, fibers of high strength and high Young's modulus (modulus of elasticity) can be spun from a single phase essentially 100% mesophase pitch which is completely anisotropic. The mesophase pitch can be derived from aromatic-based carbonaceous pitches having about 92 to 96% carbon, hydrogen of from 4 to 8%, with only minor amounts, less than 4% of hetero atoms such as oxygen, sulfur and nitrogen. The pitch precursors include petroleum pitch, coal tar pitch, and acenaphtylene pitch, as described in the patent to Chwastiak. For a further description of pitch based fibers, reference is made to the aforementioned Kirk-Othmer articles in Volume 4 and the Supplement volume, and the aforementioned U.S. Pat. No. 4,209,500 to Chwastiak, the entire disclosures of which are incorporated herein by reference.

The second type of yarn or strand employed in the present invention has a substantially lower elastic modulus and is employed in the fill direction preferably in a plain weave format. These strands are preferably formed of polymer based fibers such as rayon or PAN, with the latter being preferred. The fill direction fibers while typically exhibiting a somewhat lower carbon content than the warp direction fibers still are highly carbonized, containing about 94–99% carbon. The fill direction fibers should exhibit a carbon content of at least 90% in order to result in a composite product as described hereinafter of at least 99% carbon.

As disclosed in the aforementioned patent to Chwastiak, the carbon fibers spun from the mesophase pitch have an actual filament diameter of perhaps 10 microns or less. In order to arrive at usable fiber structures, the conventional practice is to bundle the filaments into strands, commonly referred to as yarns or tows, comprising a great many individual filaments. In experimental work carried out respecting the present invention, a pitch-based carbon yarn having about 2,000 filaments per bundle was used to provide the warp direction weave. This yarn is available from Amoco Performance Products, Inc. (Amoco) under the designation P-100. The lower modulus strands used in the fill direction were PAN carbon fibers having 1,000 strands per bundle available from Amoco under the designation T-50. The P-100 yarn has a fiber diameter of about 10 microns, a nominal modulus of elasticity of about $105 \times 10^6$ pounds per square inch (psi) and a nominal tensile strength of about $325 \times 10^3$ psi. The T-50 yarn has a fiber diameter of about 6.5 microns, a Young's modulus of about $57 \times 10^6$ and a tensile strength of about $350 \times 10^3$ psi.

In the experimental work the composite products produced in accordance with the invention were formed from highly biased plies having an end count of 24 strands to the inch of the P-100 yarns in the warp direction and an end count of 8 strands to the inch of the T-50 yarns in the fill direction. The yarns were woven in a plain weave as illustrated in FIG. 1.

The drawing is a perspective schematic view of a portion of a fabric 2 which can be employed in the present invention. The strands 4 are high modulus P-100 yarns oriented in the warp direction W. The strands 5 are the T-50 PAN yarns interwoven in the fill direction F with the T-100 strands in a plain weave format as illustrated. As shown in FIG. 1, the linear density or end count of the fill direction fibers is substantially less than the linear density of the warp direction strands. Preferably, the end count of the warp direction strands is at least twice that of the end count of the fill direction strands and in the preferred embodiment described herein, this ratio is about three to one. An end count of 24 strands per inch for the warp direction fibers versus 8 strands per inch for the fill direction fibers is used in the specific examples described hereinafter. The yarns are necessarily circular in cross-section. The yarns tend to become flattened, particularly after compression in the layup and bagging procedure.

While weaves other than the plain weave illustrated can be employed, the plain weave is preferred in carrying out the invention since it provides for close control over the orientation of the warp direction fibers. As described in greater detail below, this is significant in terms of the directional properties of the ultimate composite products, specifically thermal and electrical conductivities. However, in the broad aspect of the invention, other weaves can be employed in formulating the carbon fabrics from which the composites are produced. For example, a harness weave can be employed, but in this case, it is highly desirable that a relatively short harness of 2 to 4 warp direction yarns be provided.

As described previously, the fill direction end count desirably is substantially lower than the warp direction end count and preferably the ratio of the warp direction to fill direction end count is at least 2. The fill direction fibers are also more flexible and of smaller diameter than those in the warp direction. This arrangement lessens the likelihood of distortions, or at least reduces the occurrence of distortions, in the warp direction yarns, thus contributing to the desirable directional electrical and thermal characteristics of the composite products. In this respect, distortions or bends in the warp direction strands will reduce the desired directional characteristics, with the loss of the desired directional thermal and electrical characteristics being exacerbated by the sharpness of kinks or bends in the warp direction strands.

Any number of plies of the carbon-carbon fabric may be employed in formulating the composite, but as a practical matter, it will be preferred to employ at least 4 plies. Normally, from 4 to 12 plies will suffice for most composite structures, although greater numbers of plies may be used where extremely high strengths are required, as, for example, in air frame or space applications. Preferably, from the standpoint of good thermal conductivity, the plies are all laid up to the same orientation so that the warp direction strands are aligned with one another from one fabric ply to the next in order to maintain good directional characteristics. Even slight misalignments can result in significant reduction in the directional thermal conductivity of the resulting composite and it is preferred to align the plies within a tolerance in the warp direction of about 3° and more preferably about 1°. Such alignment is particularly significant with respect to the internal fabric plies. As will be recognized by those skilled in the art, in order to prevent oxidative degradation of the final composite product, it oftentimes will be desirable to modify one or both surfaces of the product to provide a protective silicon carbide surface coating. The forming of such protective coatings will involve conversion of a significant portion of, or possibly all of, a surface ply. Thus, the alignment of a surface ply is less significant in terms of thermal and electrical conductivities than the alignment of the internal plies.

In forming the carbon-carbon composite, a plurality of laminar plies impregnated with a carbon containing matrix material are laid up by any suitable technique such as described in the aforementioned Kirk-Othmer articles. The carbon matrix material can be of any suitable type and can take the form of pitch such as described in the aforementioned Rubin article or a resin such as described in the aforementioned patent to Yeager et al. The use of resins such as phenolic or furan type polymers is highly preferred since initial cross-linking to stabilize the layup can be accomplished at relatively low temperatures and pressures without the need for special autoclave type equipment. Where a pitch is employed to provide the matrix material, initial stabilization of the composite will require heating up to a temperature of about 500° C. with the application of high pressures. When using a thermosetting type resin, at least partial cross-linking of the resin suitable to provide a stable layup can be accomplished by heating to a temperature within the range of about 200°–400° F. and high pressures, while they can be employed, are not necessary.

The invention can be carried out to arrive at a glassy carbon matrix or a graphitic carbon matrix, as described in the aforementioned Kirk-Othmer articles, particularly in Volume 4, pages 628–630. In most cases, it will be preferred to carry out the invention in a manner to arrive at a crystalline graphitic structure for the carbonaceous matrix material. In this case, the composite product will have significant transverse thermal (or electrical) conductivity. This enables formation of composite structures having a ratio of in-plane conductivity (along the warp direction of the composite) to transverse conductivity of about 15:1 or less. Such products thus are useful as heat collectors or radiators or antenna elements since they couple cross ply or transverse conductivity along with the highly directional in-plane conductivity. However, in cases where transverse conductivity is not desired, the matrix material may be in the form of glassy carbon. In this case, composite structures having a ratio of in-plane thermal (or electrical) conductivity to transverse conductivity of about 50:1 or more can be constructed.

Regardless of whether a glassy or graphitic matrix is provided in the final product, it is preferred to use thermoset resins as described above. In this case, the protocol described in the aforementioned patent to Yeager, et al. can be followed in implementing the initial layup, bagging, curing and pyrolysis steps in carrying out the invention. However, whereas liquid phase densification is preferred in Yeager, in the present invention, it is preferred to achieve densification through chemical vapor infiltration (CVI) in which a gaseous hydrocarbon material is used as the carbon source. Preferably, a $C_1$ or $C_2$ hydrocarbon gas is employed, more specifically methane or acetylene. Following the densification step, the composite layup is heated to a temperature sufficient to graphitize the matrix material. In the graphitizing step, the material typically may be heated to a temperature within the range of about 2000°–3000° C. in an environment provided by an inert gas such as argon. The graphitizing step should be carried out at a relatively low pressure of about atmospheric pressure or below. For example, the graphitizing step may be carried out at a pressure of about 1–15 psia.

The procedure as described above may be contrasted with that disclosed in the aforementioned paper by Rubin. In the Rubin procedure, the product is first graphitized by heating to 2200° C. and then treated to reduce porosity with carbon vapor deposition at 1100° C. In the present invention, this order is reversed and the CVI step is carried out at a temperature of less than 1200° C., preferably within the range of 900°–1200° C. The CVI step is carried out at a relatively low pressure, psia or less for a period of at least 1 day. This will cause pyrolysis of the methane, acetylene or other gas used in the densification procedure, thereby cracking the gaseous hydrocarbon and evolving hydrogen gas to leave a carbonaceous residue in the carbonized matrix material.

While CVI is preferred when formulating the composite product of the present invention to provide a graphitic carbon matrix, resin densification will usually be applied where the final product has a glassy carbon matrix. In this case, a resin densification procedure such as disclosed in the aforementioned patent to Yeager et al can be employed. After completing the curing step to stabilize the product and the pyrolysis step to carbonize the matrix material, densification can be accomplished by repeated applications of liquid resin followed by curing and pyrolysis steps. Typically four liquid densification cycles may be followed. For each cycle, where a phenolic resin is used, after curing pyrolysis of the cured resin can be carried out to a temperature of about 1550° F. for a period of about 3 days.

In the experimental work carried out respecting the invention, four different carbon-carbon fabrics were used to produce a number of 4-ply composite products. One cloth designated herein as fabric A was a balanced 8-harness satin weave of T-300 PAN fibers available from Amoco Performance Products, Inc. Cloths B and C had 5-harness satin and plain weaves, respectively, of pitch-based P-100 fibers from Amoco. These cloths were woven with the P-100 yarns in both the warp and fill direction. The fourth fabric, of the type used in the present invention and designated fabric D, was a plain weave fabric having a linear density of 24 pitch-based P-100 yarns in the warp direction and 8 T-50 PAN yarns in the fill direction. The characteristics of these cloths and the fibers from which they were woven are set forth in Table I. The characteristics for cloths B and C were obtained from product information sheets available from the manufacturer. The characteristics for fabrics A and D represent averages of measured values. Although the pitch-based fibers employed in fabrics B, C and D are nominally the same, fabrics B and C were first woven and then graphitized to form the P-100 fibers. In cloth D the graphitized P-100 yarn was woven with the PAN based fill direction fibers. The fabrics A, C and D were used to form composite products having both glassy and graphitic matrices in accordance with the procedures as described above. The fabric B was used only in formulating a composite having a glassy matrix. The matrix precursor material in every case was a phenolic resin (available from Fiberite, Inc. under the designation K640) and the layup and initial cure and pyrolysis treatments were the same for all of the composite products. The graphitic matrix composites were produced by first carrying out densification with carbon vapor infiltration using methane as the carbon source followed by heating to about 2200° C. in an inert environment to effect graphitization. The heating step was carried out under argon at a pressure of 1 atmosphere for a period of 1 day.

TABLE I

|  | A | B | C | D |
|---|---|---|---|---|
| Fibers |  |  |  |  |
| Tensile Strength, × $10^3$ PSI | 250 | 325 | 325 | 341 |
| Young's Modulus, × $10^6$ PSI | 57 | 105 | 105 | 112 |
| Density, g/cm$^3$ | 1.95 | 2.15 | 2.15 | 2.16 |
| Filaments/Bundle | 3K | 2K | 2K | 2K |
| Thermal Conductivity (W/mK) | NA | 540 | 540 | 540 |
| Diameter, microns | 6.5 | 10 | 10 | 10 |
| Cloth |  |  |  |  |
| Weave | 8HS | 5HS | Plain | Plain |
| Yarn Count (ends/in) | 24 × 23 | 12 × 12 | 10 × 10 | 24 × 8 |
| Areal wt. (g/m$^2$) | 329 | 360 | 314 | 314 |
| Construction | Balance | Balance | Balance | Bias |

TABLE II

| Composite | Matrix | Fiber Vol. Fract, % | Density, g/cm$^3$ | Thickness cm (in) |
|---|---|---|---|---|
| A-GL | glassy | 63.4 | 1.58 | 0.109 (0.043) |
| A-GR | graphitic | 62.0 | 1.65 | 0.122 (0.044) |
| B-GL | glassy | 55.2 | 1.57 | 0.124 (0.049) |
| C-GL | glassy | 62.1 | 1.59 | 0.097 (0.038) |
| C-GR | graphitic | 63.8 | 1.59 | 0.094 (0.037) |
| D-GL | glassy | 53.6 | 1.60 | 0.112 (0.044) |
| D-GR | graphitic | 53.6 | 1.60 | 0.122 (0.044) |

TABLE III

|  | Tensile | | Flexural | | |
|---|---|---|---|---|---|
| Composite | Strength $10^3$ PSI | Modulus $10^6$ PSI | Strength $10^3$ PSI | Modulus $10^6$ PSI | Strength PSI |
| A-GL |  |  | 51.7 | 13.3 | 782 |
| A-GR |  |  | 56.9 | 14.1 | 705 |
| B-Gl |  |  | 37.5 | 26.4 | 802 |
| C-Gl |  |  | 28.1 | 17.0 | 667 |
| C-GR |  |  | 32.3 | 22.6 | 860 |
| D-GL |  |  | 48.6 | 27.3 | 533 |
| D-GR | 79.2 | 43.3 | 65.3 | 50.0 | 647 |

TABLE IV

|  | Therm. Diff. cm$^2$/sec. | | Therm. Cond. W/mK | | Elec. Cond. mho/cm | |
|---|---|---|---|---|---|---|
| Composite | In-Plane | Trans | In-Plane | Trans | In-Plane | Trans |
| A-GL | 0.193 | 0.020 | 21.9 | 2.3 | 168.8 | 17.7 |
| A-GR | 0.456 | 0.100 | 54.1 | 11.9 | 416.9 | 91.7 |
| B-GL | 0.719 | 0.024 | 81.2 | 2.7 | 625.8 | 20.8 |
| C-GL | 0.487 | 0.029 | 55.7 | 3.3 | 429.2 | 25.4 |
| C-GR | 1.083 | 0.151 | 123.9 | 17.3 | 954.8 | 133.3 |
| D-GL | 1.330 | 0.020 | 153.1 | 2.3 | 1179.8 | 17.7 |
| D-GR | 1.222 | 0.124 | 140.7 | 14.3 | 1084.3 | 110.2 |

The composite products having a glassy carbon matrix were formed by resin densification with phenolic resin using four resin densification cycles as described above.

Physical properties of the composite products are set forth in Table II and mechanical properties are set forth in Table III. In Table II the composites are identified by the fabric used with the suffix GL to indicate a glassy matrix and GR to indicate a graphitic matrix. The flexural strength and Young's modulus values set forth are measured in the warp direction. The interlaminar tensile strength (ILT) was measured by bonding one inch by two inch specimens to steel loading blocks with the tensile loads applied normal to the plane of the composite structure. The flexural strengths were measured using three point bending at a nominal span-to-thickness ratio of 32:1 in accordance with a ASTM D790. The composite thicknesses were nominally about 0.05 inch and the spans were nominally 1.6 inch with specimen widths of 0.75 inch. The tensile strengths were determined employing dog-bone shaped specimens based upon ASTM D638. The specimens had a length of 9 inches, a maximum width of 1 inch and a center minimum width of 0.5 inch. The values for the Young's modulus of elasticity were determined based upon the readings of strain gauges located at the center of the specimens.

Thermophysical and electrical properties of the composite products are set forth in Table IV. The electrical and thermal conductivities were calculated based upon the thermal diffusivity as measured at room temperature, about 25° C., and using a calculated value of specific heat at that temperature of 0.1723 cal./g.°C. The in-plane values given in Table IV are along the warp direction. The thermal diffusivities were determined by the laser flash diffusivity method as described in Parker, W. J. et al., "Flash Method of Determining Thermal Diffusivity, Heat Capacity, and Thermal Conductivity," *J. Appl. Phys.*, Vol. 32, pp 1679–84, 1961 and Bucknam, M. A. et al., "The Measurement of Thermal Conductivities of Refractories by the Laser-Flash Method," Transactions of the British Ceramic Society, Vol. 82 (1983). The thermal conductivities were calculated based upon the thermal diffusivities, bulk densities, and the calculated specific heat value at 25° C. as described above, in accordance with the procedure outlined in the Parker et al. paper. The electrical conductivities are calculated values based on the assumption that they correlate to thermal conductivity as follows:

$$\sigma = 7.7065 \, C$$

wherein:
$\sigma$ is electrical conductivity in mho/cm
C is thermal conductivity in w/mk For each of the composite products, the in-plane thermal (and electrical) conductivities were substantially less than the thermal conductivities which would be predicted by the "law of mixtures." The law of mixtures would, of course, indicate the highest possible theoretical values and in actual practice cannot be reached because of factors such as broken fibers, kinks and other imperfections. Considering the composite structures having glassy matrix materials, the products B-GL, C-GL and D-GL had thermal conductivities of about 58, 43, and 53, percent of theoretical, respectively. The in-plane thermal conductivity of both the glassy and graphitic structures having the P-100 fibers are substantially higher than those observed for the composites A-GL and A-GR based upon the PAN carbon fabrics.

Table IV shows the substantial differences in transverse thermal conductivity and electrical conductivity as determined for the graphitic and glassy matrices. As indicated in Table III, the flexural modulus is substantially higher for the graphitic matrix than for the glassy matrix, and in both cases, the D based composites exhibit substantially higher elastic moduli than the other products.

Relative warp and fill direction mechanical characteristics were determined for composites D-GL and D-GR after curing and initial pyrolysis to carbonize the matrix but before densification. At this stage, composite D-GL exhibited flexural strengths in the warp and fill directions of $43.9 \times 10^3$ and $9.5 \times 10^3$ psi, respectively. The warp direction modulus of elasticity was $27.9 \times 10^6$ psi. For the fill direction this modulus was too low to be measured. Similar mechanical characteristics were shown for composite D-GR prior to densification. Here, the flexural warp direction strength and elastic modulus were $50.3 \times 10^3$ psi and $36.0 \times 10^6$ psi. In the fill direction, the modulus was again too low to measure; the flexural strength was $10.0 \times 10^3$ psi.

Having described specific embodiments of the present invention, it will be understood that modification thereof may be suggested to those skilled in the art, and it is intended to cover all such modifications as fall within the scope of the appended claims.

I claim:

1. In a method of forming a carbon-carbon composite structure, the steps comprising:
   a) establising a laminate layup of a plurality of laminate plies of carbon fabric impregnated with a carbon containing matrix material, said plies of carbon fabric being formed of pitch-based relatively high modulus carbon strands in the warp direction and relatively lower modulus carbon strands in the fill direction, said higher modulus carbon strands having a substantially higher end count in the warp direction than the end count of the lower modulus carbon strands in the fill direction;
   b) pyrolyzing said laminate layup at a pyrolysis temperature sufficient to carbonize said matrix material;
   c) densifying the thus carbonized matrix material; and
   d) heating the laminate layup, having the thus densified carbonized matrix material, at an elevated temperature in excess of said pyrolysis temperature sufficient to graphitize said densified carbonized matrix material.

2. The method of claim 1, wherein said laminate layup is established in step (a) by aligning said plies of carbon fabric with one another in the warp direction.

3. The method of claim 2, wherein said plies of carbon fabric are aligned in the warp direction to a tolerance of about 3°.

4. The method of claim 1, wherein said carbon fabric has a plain weave.

5. The method of claim 1, wherein the ratio of the end count of carbon strands in the warp direction to the end count of carbon strands in the fill direction is at least 2.

6. The method of claim 1, wherein said carbonized matrix material is densified by infiltration of the laminate layup having the carbonized matrix material with a gaseous hydrocarbon based material and heating the thus infiltrated laminate layup at a temperature sufficient to crack said gaseous hydrocarbon based material and evolving gas to leave a carbonaceous residue in said carbonized matrix material.

7. The method of claim 6, wherein said carbonized matrix material is densified by infiltration of the laminate layup having the carbonized matrix material with a $C_1$ or $C_2$ hydrocarbon gas and heating the thus infiltrated laminate layup to a temperature sufficient to crack said hydrocarbon gas and evolving hydrogen from said infiltrated laminate layup.

8. The method of claim 7, wherein said laminate layup having the carbonized matrix material is heated during the densifying step to a temperature within the range of 900°–1200° C. under a pressure of no more than 15 psia for a period of at least one day.

9. The method of claim 1, wherein said relatively lower modulus carbon strands are comprised of polymer based fibers.

10. The method of claim 9, wherein said relatively lower modulus carbon strands are comprised of PAN fibers.

11. In a method of forming a carbon-carbon composite structure, the steps comprising:
   a) establishing a laminate layup of a plurality of laminate plies of carbon fabric impregnated with a carbon containing matrix material, said plies of carbon fabric being formed of pitch-based relatively high modulus carbon strands in the warp direction and polymer based relatively lower modulus carbon strands in the fill direction;
   b) pyrolyzing said laminate layup at a pyrolysis temperature sufficient to carbonize said matrix material;
   c) densifying the thus carbonized matrix material by infiltration of the laminate layup, having the thus carbonized matrix material, with a gaseous hydrocarbon based material and evolving gas to leave a carbonaceous residue in said carbonized matrix material; and
   d) heating the laminate layup, having the thus densified carbonized matrix material, at an elevated temperature in excess of said pyrolysis temperature sufficient to graphitize said densified carbonized matrix material.

12. The method of claim 11, wherein said carbon fabric has a plain weave.

13. The method of claim 11, wherein said carbonized matrix material is densified by infiltration of said laminate layup having the carbonized matrix material with a gaseous hydrocarbon based material and heating the thus infiltrated laminate layup at a temperature sufficient to crack said gaseous hydrocarbon based material and evolving gas to leave a carbonaceous residue in said carbonized matrix material.

14. The method of claim 13, wherein said carbonized matrix material is densified by infiltration of the laminate layup having the carbonized matrix material with a $C_1$ or $C_2$ hydrocarbon gas and by heating the thus infiltrated laminate layup to a temperature sufficient to crack said hydrocarbon gas and evolving hydrogen from said infiltrated laminate layup.

15. The method of claim 11, wherein said relatively lower modulus carbon strands are comprised of polymer based fibers.

16. A carbon-carbon composite product, comprising:
   a) a plurality of laminate plies, each comprising a carbon fabric having pitch-based high modulus carbon strands in the warp direction and lower modulus polymer based carbon strands in the fill direction;
   b) said lower modulus strands having a substantially lower end count in the fill direction than the end count of said high modulus strands in the warp direction; and
   c) a carbonaceous matrix material integrated with the fabrics of the laminate plies.

17. The product of claim 16, wherein said fabrics are aligned with one another in the warp direction.

18. The product of claim 16, wherein said carbonaceous matrix material has a crystalline graphitized structure.

19. The product of claim 18, wherein the ratio of the in-plane thermal conductivity to the transverse thermal conductivity is 15:1 or less.

20. The product of claim 16, wherein said carbonaceous matrix material is glassy carbon.

21. The product of claim 20, wherein the ratio of the in-plane thermal conductivity to the transverse thermal conductivity is 50:1 or more.

* * * * *